United States Patent
Cheng

(10) Patent No.: US 10,600,492 B2
(45) Date of Patent: Mar. 24, 2020

(54) HIGH STABILITY SHIFT REGISTER WITH ADJUSTABLE PULSE WIDTH

(71) Applicant: INT TECH CO., LTD., Hsinchu County (TW)

(72) Inventor: Shih-Song Cheng, Kaohsiung (TW)

(73) Assignee: INT TECH CO., LTD., Hsinchu County (TW)

( * ) Notice: Subject to any disclaimer, the term of this patent is extended or adjusted under 35 U.S.C. 154(b) by 162 days.

(21) Appl. No.: 15/722,457

(22) Filed: Oct. 2, 2017

(65) Prior Publication Data

US 2018/0096732 A1  Apr. 5, 2018

(30) Foreign Application Priority Data

Oct. 4, 2016  (TW) .............................. 105132005 A

(51) Int. Cl.
| | | |
|---|---|---|
| G11C 19/00 | (2006.01) | |
| G11C 19/18 | (2006.01) | |
| G09G 3/20 | (2006.01) | |
| G11C 19/28 | (2006.01) | |
| G09G 5/00 | (2006.01) | |
| G09G 3/36 | (2006.01) | |

(52) U.S. Cl.
CPC ............ *G11C 19/184* (2013.01); *G09G 3/20* (2013.01); *G09G 5/003* (2013.01); *G11C 19/28* (2013.01); *G09G 3/3677* (2013.01); *G09G 5/008* (2013.01); *G09G 2300/0408* (2013.01); *G09G 2310/0286* (2013.01); *G09G 2310/06* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 8,339,424 | B2* | 12/2012 | Jeong | G09G 3/3266 345/211 |
| 2007/0046608 | A1* | 3/2007 | Chung | G09G 3/3266 345/92 |
| 2010/0013824 | A1* | 1/2010 | Kim | G09G 3/3266 345/214 |
| 2012/0176417 | A1* | 7/2012 | Jang | G09G 3/3266 345/690 |
| 2013/0342584 | A1* | 12/2013 | Song | G09G 3/30 345/690 |
| 2017/0116920 | A1* | 4/2017 | Kwon | G09G 3/3266 |

* cited by examiner

*Primary Examiner* — Tuan T Lam
(74) *Attorney, Agent, or Firm* — WPAT, P.C., Intellectual Property Attorneys; Anthony King

(57) ABSTRACT

The present invention discloses a high stability shift register with adjustable pulse width to be achieved by a circuit structure through purely N-type transistors or purely P-type transistors. The structure comprises eight thin film transistors and a capacitor, and uses the 8T1C structure as a repeating unit. The invention can obtain an output signal from an input signal, two DC signals and two AC signals. The AC signal is a two line-time frequency pulse wherein the pulse width is smaller or equal to the line-time. The output signal will shift a line-time on the time axis with the input signal, and as an input signal to the next shift register in sequence. Compared with the conventional technique, the invention reduces the amount of the components to obtain a high stability and adjustable pulse width shift register.

9 Claims, 19 Drawing Sheets

HIGH STABILITY SHIFT REGISTER WITH ADJUSTABLE PULSE WIDTH

BACKGROUND

(1) Field of the Invention

The present invention is directed to a shift register, and in particular, to a high stability shift register with adjustable pulse width.

(2) Description of Related Art

In the field of display technology, the shift register has been widely used as the gate driver and has been integrated in the panel driving system, which is often referred to as the gate driver on array (GOA); this is of great importance to the development of narrow border displays. By using repetitive units of simple shift register circuits, instead of using the conventional one-by-one scanning technique, it is feasible to fulfill the requirements for the scan lines of conventional panel driving systems, and accordingly, the layout area is reduced significantly, thereby realizing the pursuit of a narrow border. Moreover, to conform to the manufacturing process of the panels, the circuit structure is often implemented using a single type of thin-film transistors (TFTs), e.g., either N-type TFTs or P-type TFTs. The scan line is built at a fixed pulse width using one line-time as the unit, and is sequentially transmitted in the time axis using the shift having the unit of one line-time; the time required for the transmission across the whole panel is defined as the frame time, which is the product of one line-time multiplied by the resolution in the scanning direction. Active matrix displays render the image by use of the operation of the pixel circuit in the pixel area, and hence, they need a control signal that is more complex than the common, conventional scan lines. Accordingly, the implementation of the gate driver shall be more flexible, and maintain a simple circuit structure, so as to avoid creating a burden to the layout area.

However, conventional shift registers for use as the GOA for driving the panel cannot achieve a full shift register functionality due to the limitation arose from the simple circuit structure of these shift registers; for example, for the structure adopting the P-type transistors, it is not feasible to give a low voltage VGL signal in two consecutive clock cycles.

FIG. 1 is a schematic diagram illustrating a convention shift register structure, which is a 10T3C structure; although it has the function of adjustable pulse width, it is subject to a limitation that the adjustment flexibility shall be an even multiple of the line-time, and hence, it is not workable to achieve an adjustment flexibility which uses a minimum of a single line-time, and accomplish any other functionality other than being a light-emitting switch. Moreover, in view of the expectation in the development of the narrow border specification, the number of the components used in the shift register shall be as few as possible; if the number of the capacitor coupling was reduced, the direct bias would control the switch, thereby resulting in a more stable system and reducing the failure risk after the reliability test. Further, if the number of the component used was reduced, the voltage difference of the bias voltage range of the operation of the component could be reduced, thereby reducing the burden of design and reducing the failure risk after the reliability test.

In view of the foregoing, there are many deficiencies in the conventional art, and the conventional design is not yet satisfactory and awaits further improvement. It may thus be desirable to have a high stability shift register with adjustable pulse width, which may satisfy the need of reducing the number of the components to maintain a high stability and providing the functionality of an adjustable pulse width.

SUMMARY

One aspect of the present invention provides a high stability shift register with adjustable pulse width. According to one embodiment of the present invention, the present high stability shift register with adjustable pulse width comprises a first signal processor, a second signal processor, and a third signal processor. The first signal processor receives a first voltage and generates a first signal and a second signal in response to a first sub-control signal and a second sub-control signal. The second signal processor receives the first voltage, and generates a third signal and a fourth signal in response to a third sub-control signal, the first signal and the second signal. The third signal processor receives the first voltage and a second voltage that has a voltage level different from that of the first voltage, and generates an output signal in response to the third signal and the fourth signal.

In some embodiments, the second sub-control signal is a first clock signal, in which the first clock signal is equal to or less than the pulse width of one line-time, and the cycle of the first clock signal is two line-times.

Further, the pulse width of the first sub-control signal is (2M−1) line-times, and M is a positive integer.

Moreover, the present high stability shift register with adjustable pulse width can be used in a gate driver on array (GOA) for driving a panel system.

As compared with conventional techniques, the present high stability shift register with adjustable pulse width uses the first signal processor, the second signal processor and the third signal processor to achieve the shift register function of adjustable pulse width, and therefore, the number of the component is reduced, which in turn results in a decrease in the amount of data shifting, as well as an increase in the stability, and therefore is advantageous to the development of a narrower border and a higher resolution of the display.

Advantages and principles of the present disclosure are better understood from the following detailed description when read with the accompanying figures.

DETAILED DESCRIPTION

The purpose, technical solution and advantage of the present invention will be better understood from the following detailed description read in light of the accompanying drawings.

Figure 1:
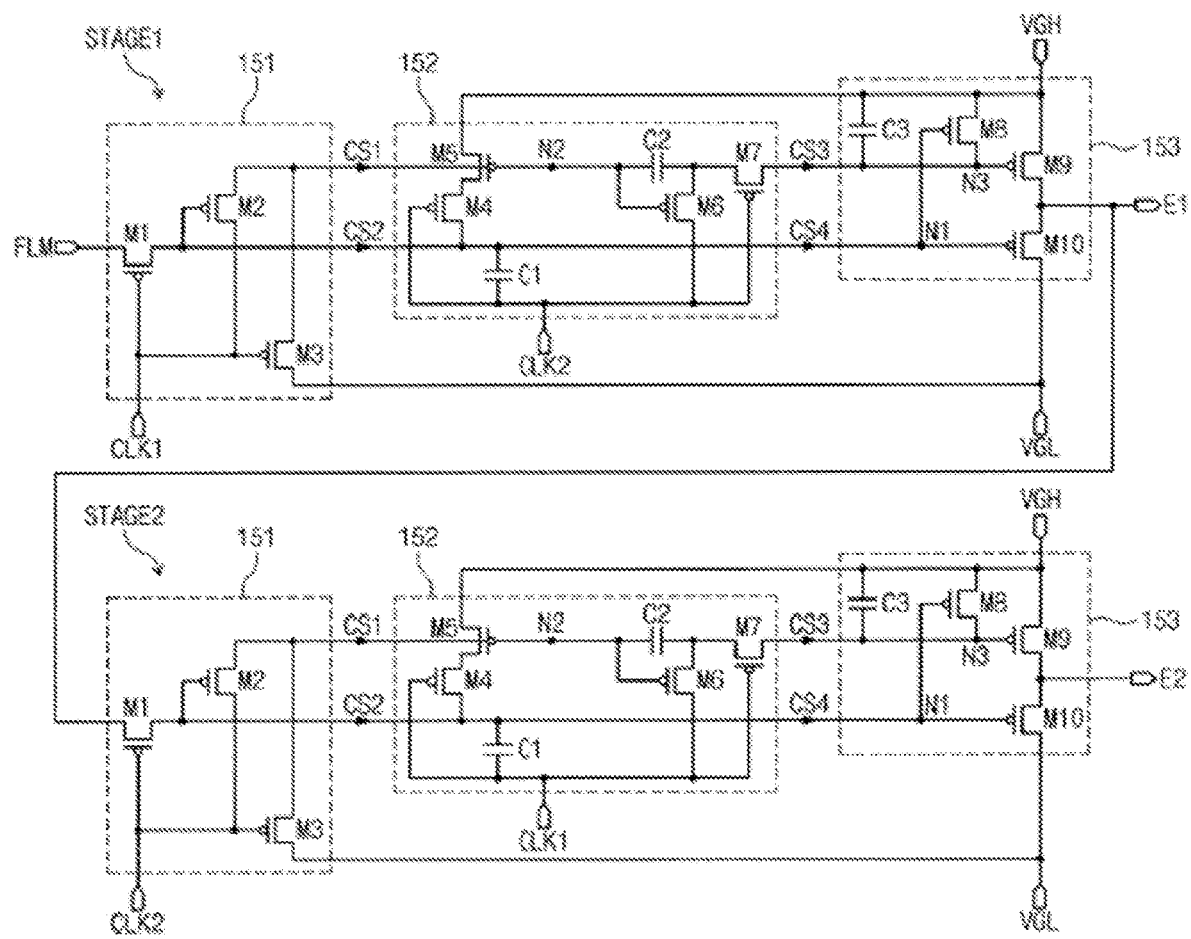
FIG. 1 is a schematic diagram illustrating a conventional shift register.
Figure 2:
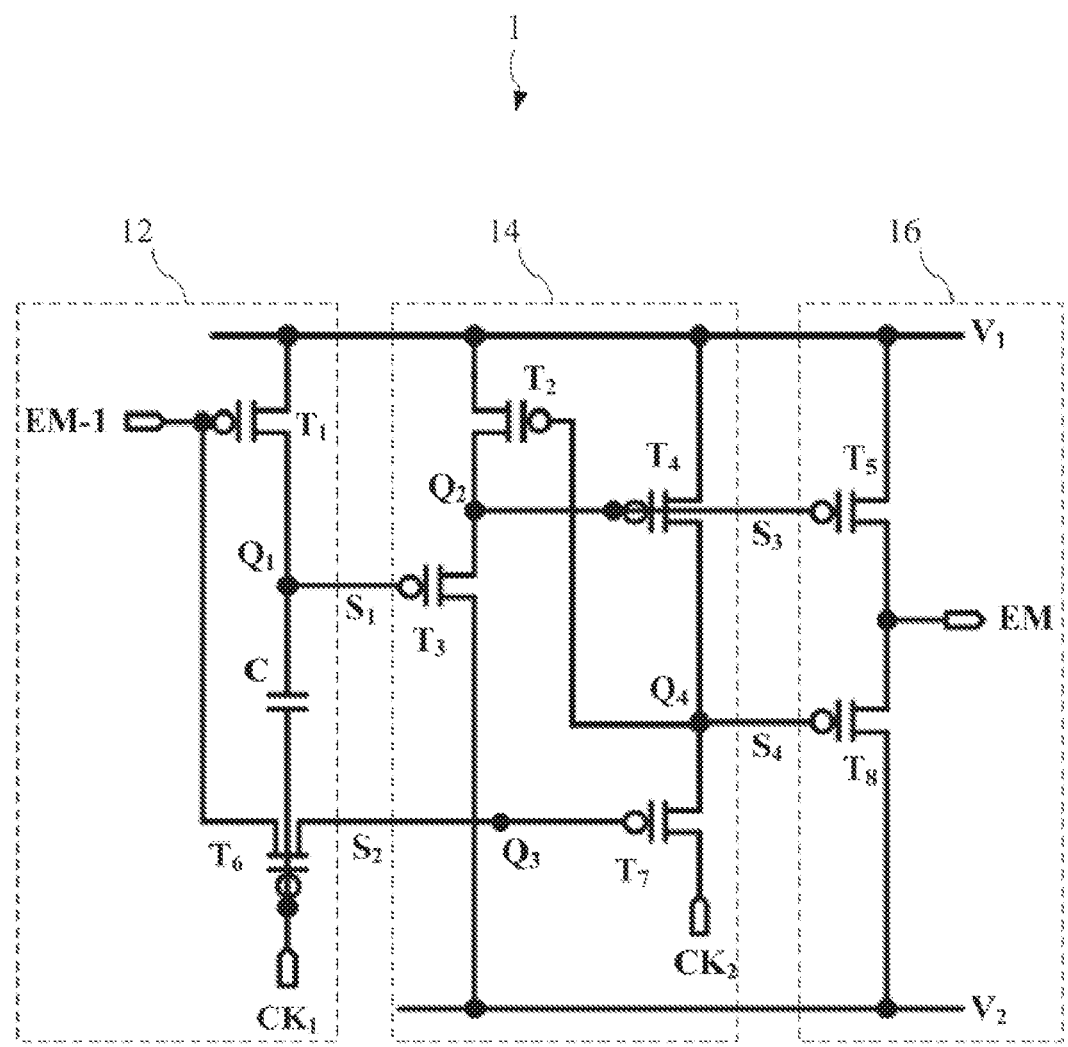
FIG. 2 is a schematic diagram illustrating a high stability shift register with adjustable pulse width according to one embodiment of the present invention.

Reference is made to FIG. 2, which is a schematic diagram illustrating a high stability shift register with adjustable pulse width 1 according to one embodiment of the present invention. One aspect of the present invention is directed to a high stability shift register with adjustable pulse width 1. According to one embodiment of the present invention, the high stability shift register with adjustable pulse width 1 comprises a first signal processor 12, a second signal processor 14, and a third signal processor 16. The first signal processor 12 receives a first voltage $V_1$ and generates a first signal St and a second signal $S_2$ in response to a first sub-control signal EM-1 and a second sub-control signal. The second signal processor 14 receives the first voltage $V_1$, and generate a third signal $S_3$ and a fourth signal $S_4$ in response to a third sub-control signal, the first signal $S_1$, and the second signal $S_2$. The third signal processor 16 receives the first voltage $V_1$ and a second voltage $V_2$ that has a voltage level different from that of the first voltage $V_1$, and generates an output signal EM in response to the third signal $S_3$ and the fourth signal $S_4$.

In some embodiments, the second sub-control signal is a first clock signal $CK_1$; the first clock signal $CK_1$ has a pulse width that is less than or equal to one line-time, and the cycle of the first clock signal $CK_1$ is two line-times.

Further, the third sub-control signal is a second clock signal $CK_2$, which is shifted from the first clock signal $CK_1$ by one line-time (L-T).

The first signal processor 12 comprises a first transistor $T_1$, a sixth transistor $T_6$, and a capacitor C. The first transistor $T_1$ has a first source terminal that is applied with the first voltage $V_1$ and a first gate terminal that is applied with the first sub-control signal EM-1. The sixth transistor $T_6$ has a sixth source terminal that is applied with the first sub-control signal EM-1 and a sixth gate terminal that is applied with the second sub-control signal. The capacitor C has a first electrode that is applied with the second sub-control signal and a second electrode connected with a first node $Q_1$, wherein the first node $Q_1$ is electrically connected with a first drain terminal of the first transistor $T_1$. In some embodiments, the first signal $S_1$ is outputted from the first node $Q_1$, and the second signal $S_2$ is outputted from a sixth drain terminal of the sixth transistor $T_6$.

The second signal processor 14 comprises a second transistor $T_2$, a third transistor $T_3$, a fourth transistor $T_4$, and a seventh transistor $T_7$. The second transistor $T_2$ has a second source terminal that is applied with the first voltage $V_1$. The third transistor $T_3$ has a third source terminal that is applied with the second voltage $V_2$, a third gate terminal connected with the first node $Q_1$, and a third drain terminal connected with a second drain terminal of the second transistor $T_2$. The fourth transistor $T_4$ has a fourth source terminal that is applied with the first voltage $V_1$, and a fourth gate terminal connected with a second node $Q_2$ between the second drain terminal and third drain terminal. The seventh transistor $T_7$ has a seventh source terminal that is applied with the third sub-control signal, a seventh gate terminal connected with the sixth drain terminal, and a seventh drain terminal connected with a fourth drain terminal of the fourth transistor $T_4$. In some embodiments, a fourth node $Q_4$ and a second gate terminal connected with the second transistor $T_2$ are disposed between the fourth drain terminal and the seventh drain terminal, in which the third signal $S_3$ is outputted from the second node $Q_2$, and the fourth signal $S_4$ is outputted from the fourth node $Q_4$.

The third signal processor 16 comprises a fifth transistor $T_5$, an eighth transistor $T_8$, and an output terminal. The fifth transistor $T_5$ has a fifth source terminal that is applied with the first voltage $V_1$ and a fifth gate terminal connected with the second node $Q_2$. The eighth transistor $T_8$ has an eighth source terminal that is applied with the second voltage $V_2$ and an eighth gate terminal connected with the fourth node $Q_4$. The output terminal is connected with an eighth drain terminal of the eighth transistor $T_8$ and a fifth drain terminal of the fifth transistor $T_5$, and is configured to generate an output signal EM. In some embodiments, the transistors in the first signal processor 12, the second signal processor 14 and the third signal processor 16 are transistors of the same polarity.

Figure 3:
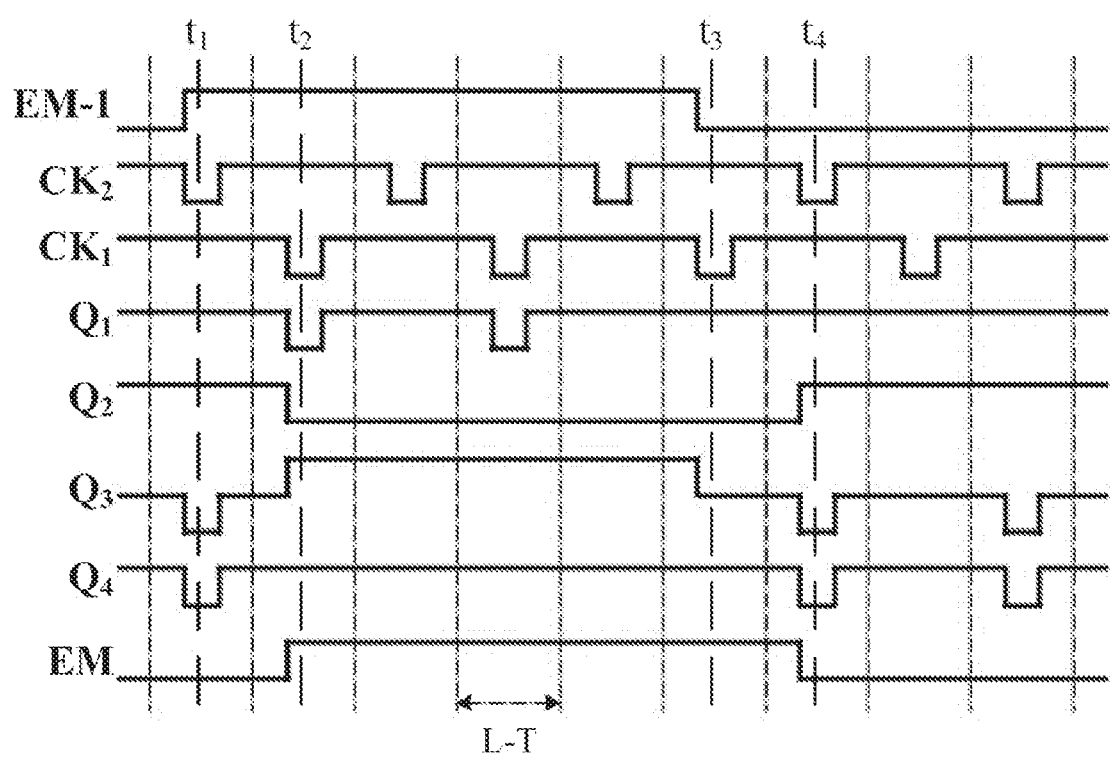
FIG. 3 is an operation timing diagram of a high stability shift register with adjustable pulse width according to one embodiment of the present invention.
Figure 4:
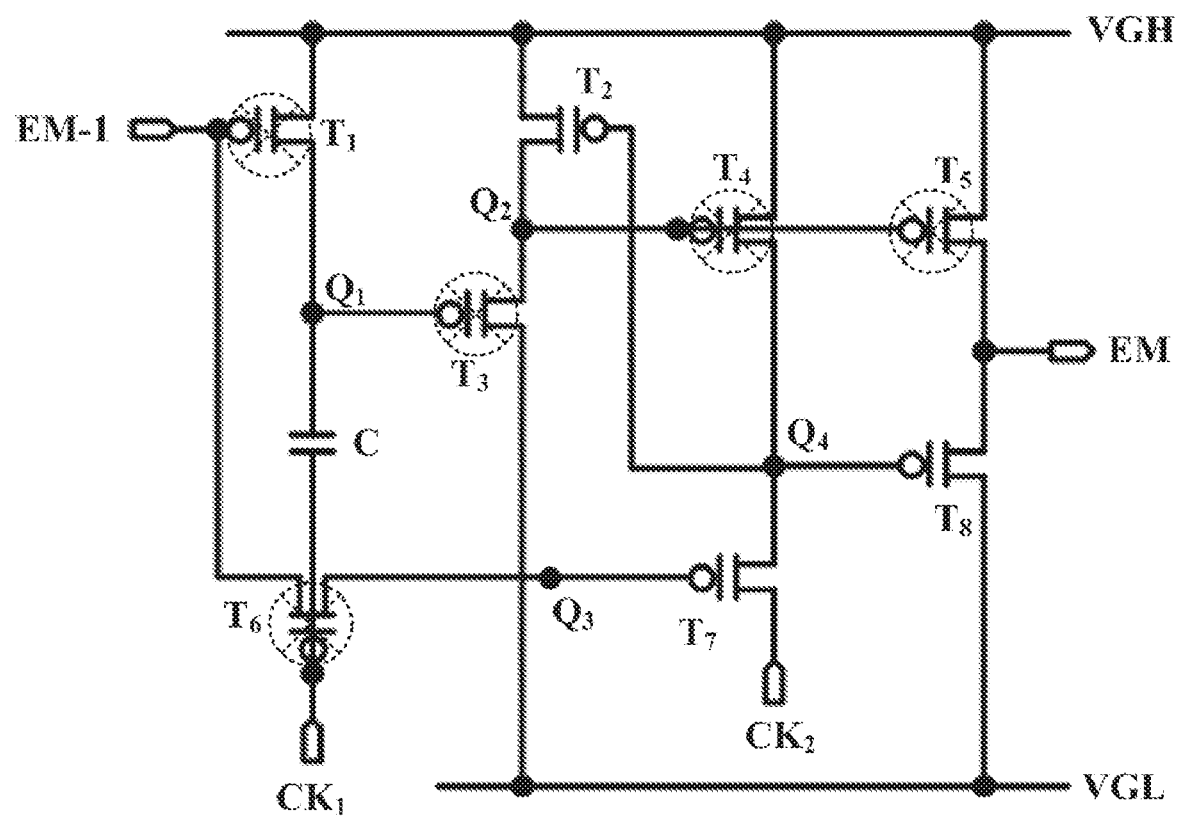
FIG. 4 is a schematic diagram illustrating a status of a high stability shift register with adjustable pulse width according to one embodiment of the present invention at a first time point.
Figure 5:
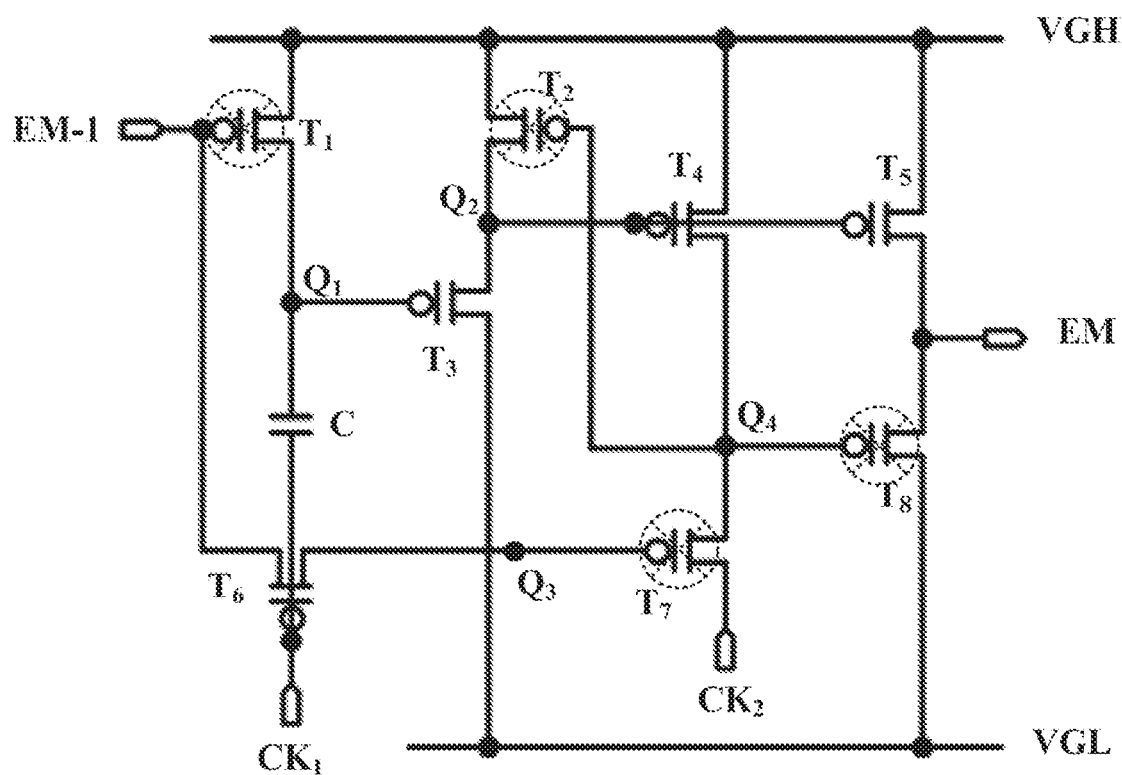
FIG. 5 is a schematic diagram illustrating a status of a high stability shift register with adjustable pulse width according to one embodiment of the present invention at a second time point.
Figure 6:
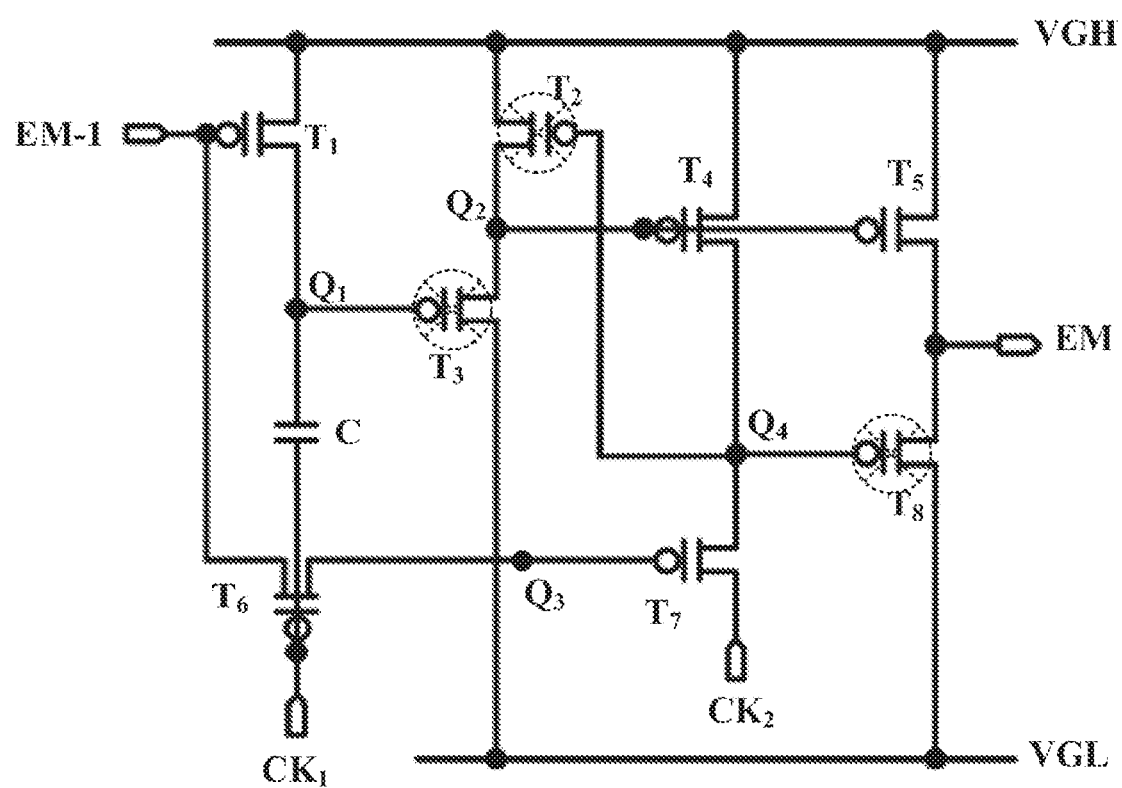
FIG. 6 is a schematic diagram illustrating a status of a high stability shift register with adjustable pulse width according to one embodiment of the present invention at a third time point.
Figure 7:
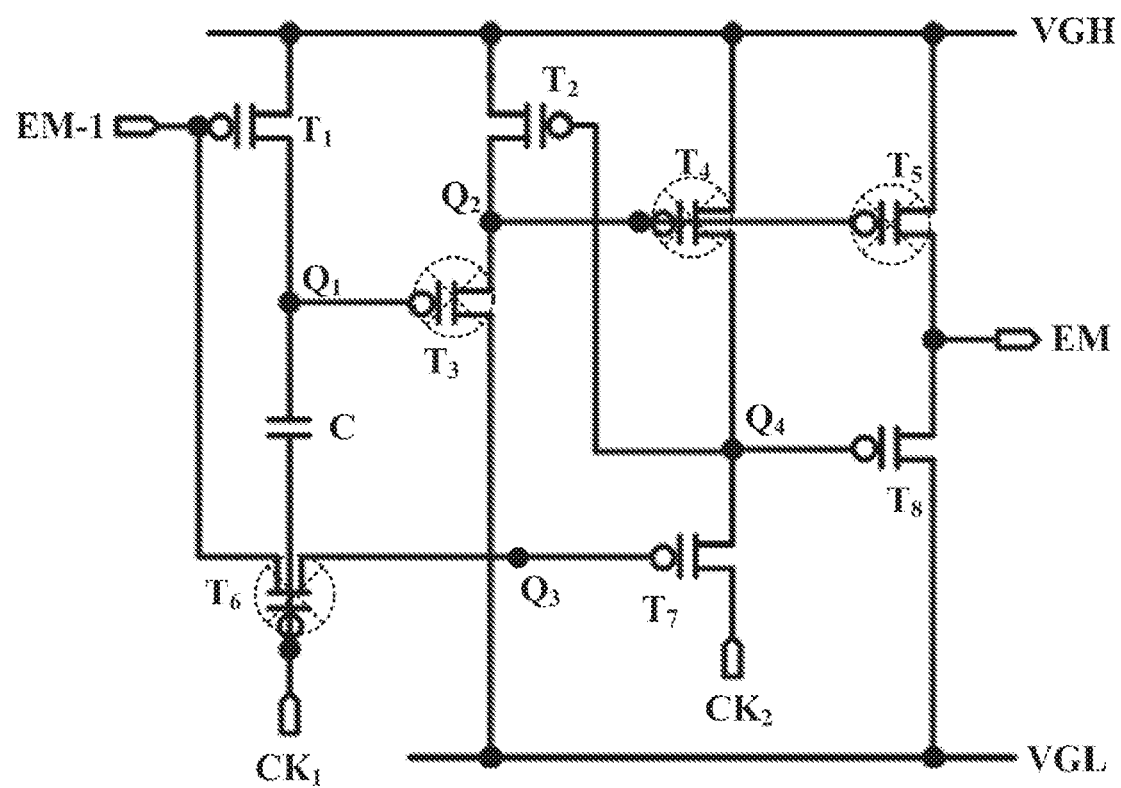
FIG. 7 is a schematic diagram illustrating a status of a high stability shift register with adjustable pulse width according to one embodiment of the present invention at a fourth time point.

Reference is now made to FIG. 3 to FIG. 7; FIG. 3 is an operation timing diagram of a high stability shift register with adjustable pulse width 1 according to one embodiment of the present invention; FIG. 4 is a schematic diagram illustrating a status of a high stability shift register with adjustable pulse width 1 according to one embodiment of the present invention at a first time point $t_1$; FIG. 5 is a schematic diagram illustrating a status of a high stability shift register with adjustable pulse width 1 according to one embodiment of the present invention at a second time point $t_2$; FIG. 6 is a schematic diagram illustrating a status of a high stability shift register with adjustable pulse width 1 according to one embodiment of the present invention at a third time point $t_3$; FIG. 7 is a schematic diagram illustrating a status of a high stability shift register with adjustable pulse width 1 according to one embodiment of the present invention at a fourth time point $t_4$. In this embodiment, the present high stability shift register with adjustable pulse width 1 further comprises a third node $Q_3$, which is disposed between the sixth drain terminal and the seventh gate terminal. The first voltage $V_1$ may be a high voltage VGH direct current signal, and the second voltage $V_2$ may be a low voltage VGL direct current signal, whereas the transistors used in this embodiment are P-type thin film transistors. The low voltage VGL direct current signal, the first clock signal $CK_1$ of the low voltage VGL, or the second clock signal $CK_2$ of the low voltage VGL may be used to conduct the current from the source terminal to the drain terminal of these transistors.

Reference is now made to FIG. 4, at the first time point $t_1$, the first sub-control signal EM-1 is a high voltage VGH, and hence, the first transistor $T_1$ is turned off, so that the first node $Q_1$ maintains the status in a previous time point (VGH). Since the first clock signal $CK_1$ is a high voltage VGH, the sixth transistor $T_6$ will be turned off, so that the third node $Q_3$ is lower than the low voltage VGL, which in turn causes the seventh transistor $T_7$ to operate, so that the fourth node $Q_4$ maintains the low voltage VGL, which prompts the eighth transistor $T_8$ to continue the operation. Since the second node $Q_2$ is a high voltage VGH, the fourth transistor $T_4$ and the fifth transistor $T_5$ are turned off, thereby prompting the output signal EM to become VGL+|Vth|, where the Vth is a threshold voltage of the transistor.

Reference is now made to FIG. 5, at the second time point $t_2$, the first clock signal $CK_1$ becomes a low voltage VGL, and the first node $Q_1$ becomes the low voltage VGL under the action of the coupling of the capacitor C, thereby turning on the third transistor $T_3$; moreover, since the first clock signal $CK_1$ turns on the sixth transistor $T_6$, the third node $Q_3$ becomes a high voltage VGH due to the input of the first sub-control signal EM-1, and therefore, the seventh transistor $T_7$ is turned off. The fourth node $Q_4$ is a high voltage VGH; the second transistor $T_2$ is turned off, and the conduction of the third transistor $T_3$ causes the status of the second node $Q_2$ to change (VGL+|Vth|), thereby turning on the fourth transistor $T_4$ and the fifth transistor $T_5$. Since the fifth transistor $T_5$ is turned on and the eighth transistor $T_8$ is turned off, the output signal EM is a high voltage VGH.

Reference is now made to FIG. 6, at the third time point $t_3$, the first sub-control signal EM-1 becomes a low voltage VGL, and the first node $Q_1$ becomes a high voltage VGH due to the conduction of the first transistor $T_1$, thereby turning off the third transistor $T_3$, so that the second node $Q_2$ maintains the previous status (VGL+|Vth|). Since the first clock signal $CK_1$ is a low voltage VGL, the sixth transistor $T_6$ will be turned on, and hence the third node $Q_3$ becomes a lower voltage (VGL+|Vth|), thereby turning on the seventh transistor $T_7$, which in turn causes the fourth node $Q_4$ to maintain a high voltage VGH. Since the fifth transistor $T_5$ is turned on and the eighth transistor $T_8$ is turned off, the output signal EM is a high voltage VGH.

Reference is now made to FIG. 7, at the fourth time point $t_4$, the first clock signal $CK_1$ becomes a high voltage VGH, causing the floating of the third node $Q_3$; and the second clock signal $CK_2$ becomes a low voltage VGL, prompting the third node $Q_3$ to decrease to an even lower voltage (<VGL−|Vth|), thereby turning on the seventh transistor $T_7$, and the fourth node $Q_4$, due to the conduction of the seventh transistor $T_7$, writes in a low voltage VGL, prompting the eighth transistor $T_8$ to be turned on. The second node $Q_2$, due to the conduction of the fourth node $Q_4$, becomes the high voltage VGH, and hence, the fourth transistor $T_4$ and the fifth transistor $T_5$ are turned off. Since the fifth transistor $T_5$ is turned off, and the eighth transistor $T_8$ is conducted, the output signal EM is VGL+|Vth|.

It is feasible to control the output signal EM so that it becomes the VGH or the VGL+|Vth| by repeating the operations from the first time point $t_1$ to the fourth time point $t_4$.

Figure 8:
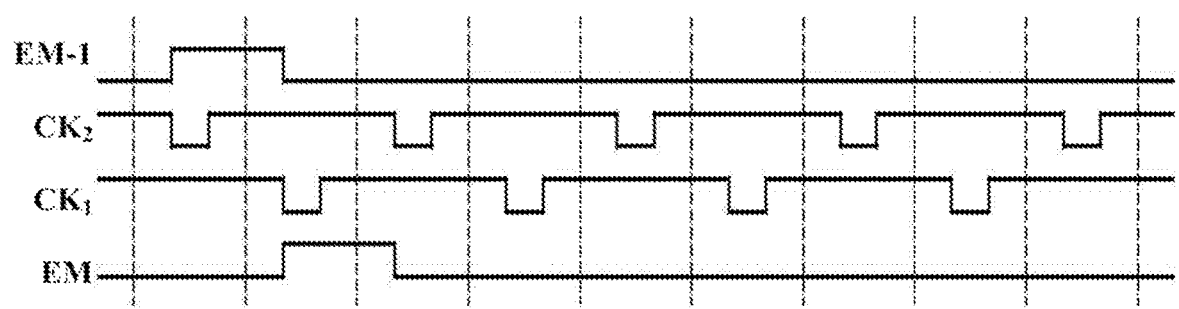
FIG. 8 is an operation timing diagram of the present high stability shift register with adjustable pulse width, in which the input pulse width is the 1-fold line-time.
Figure 9:
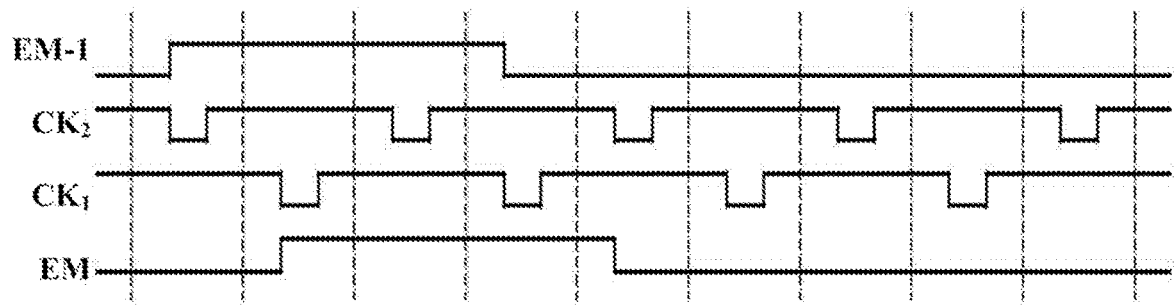
FIG. 9 is an operation timing diagram of the present high stability shift register with adjustable pulse width, in which the input pulse width is the 3-fold line-time.
Figure 10:
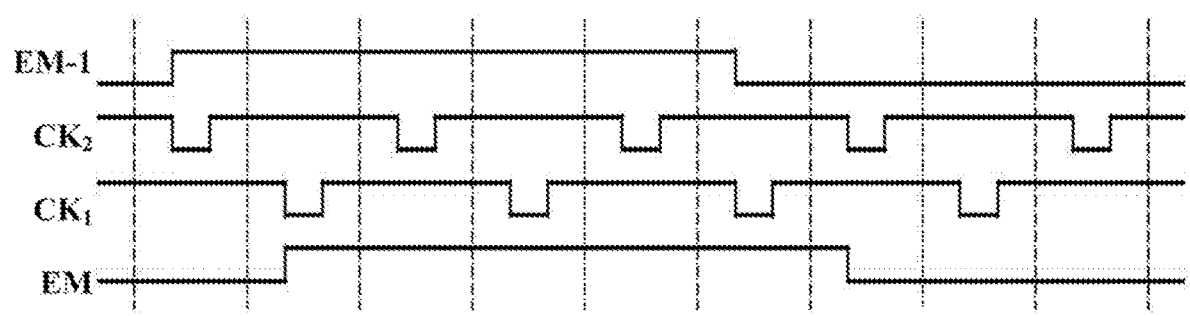
FIG. 10 is an operation timing diagram of the present high stability shift register with adjustable pulse width, in which the input pulse width is the 5-fold line-time.

Reference is now made to FIG. 8 to FIG. 10, FIG. 8 is an operation timing diagram of the present high stability shift register with adjustable pulse width 1, in which the input pulse width is the 1-fold line-time; FIG. 9 is an operation timing diagram of the present high stability shift register with adjustable pulse width 1, in which the input pulse width is the 3-fold line-time; FIG. 10 is an operation timing diagram of the present high stability shift register with adjustable pulse width 1, in which the input pulse width is the 5-fold line-time. According to the structure disclosed above, it is feasible to adjust the pulse width of the first sub-control signal EM-1 to obtain output signals EM having different pulse widths. In some embodiments, the pulse width of the first sub-control signal EM-1 is (2M−1) line-times, and M is a positive integer. Moreover, the output signal EM shifts by one time line with respect to the first sub-control signal EM-1.

Figure 11:
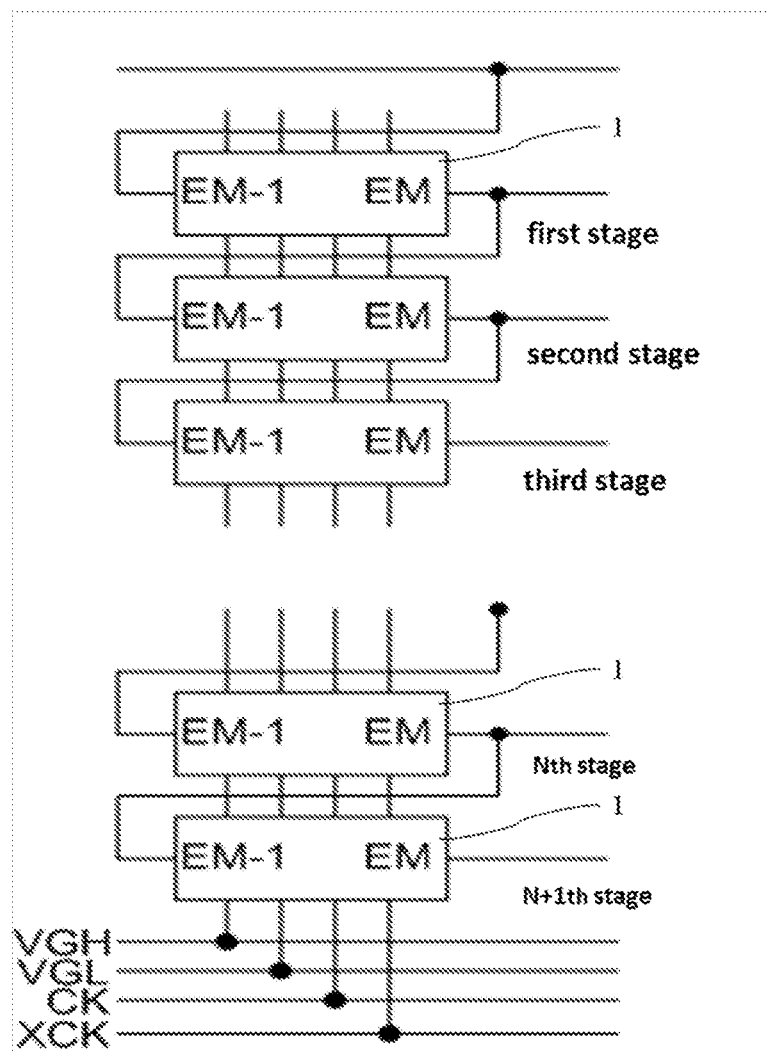
FIG. 11 is a schematic diagram illustrating a shift register group consisting of multiple high stability shift registers with adjustable pulse width that are connected in series.
Figure 12:
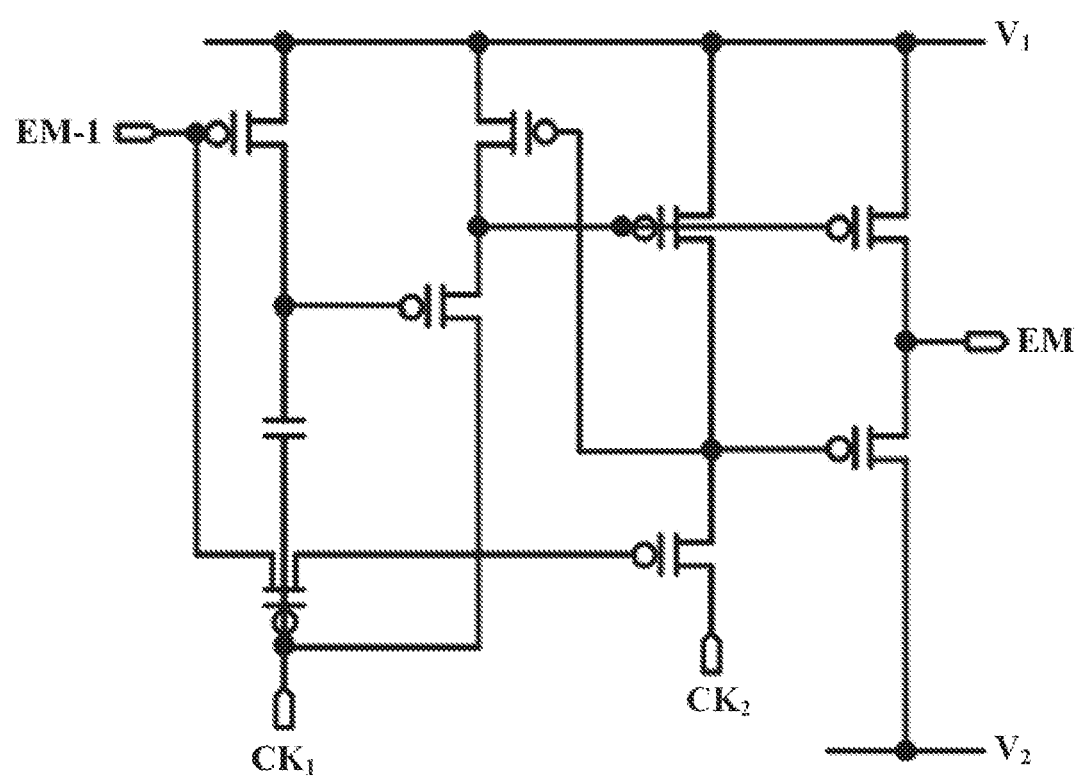
FIG. 12 to FIG. 18 are schematic diagrams illustrating the high stability shift registers with adjustable pulse width according to various embodiments of the present invention.
Figure 13:
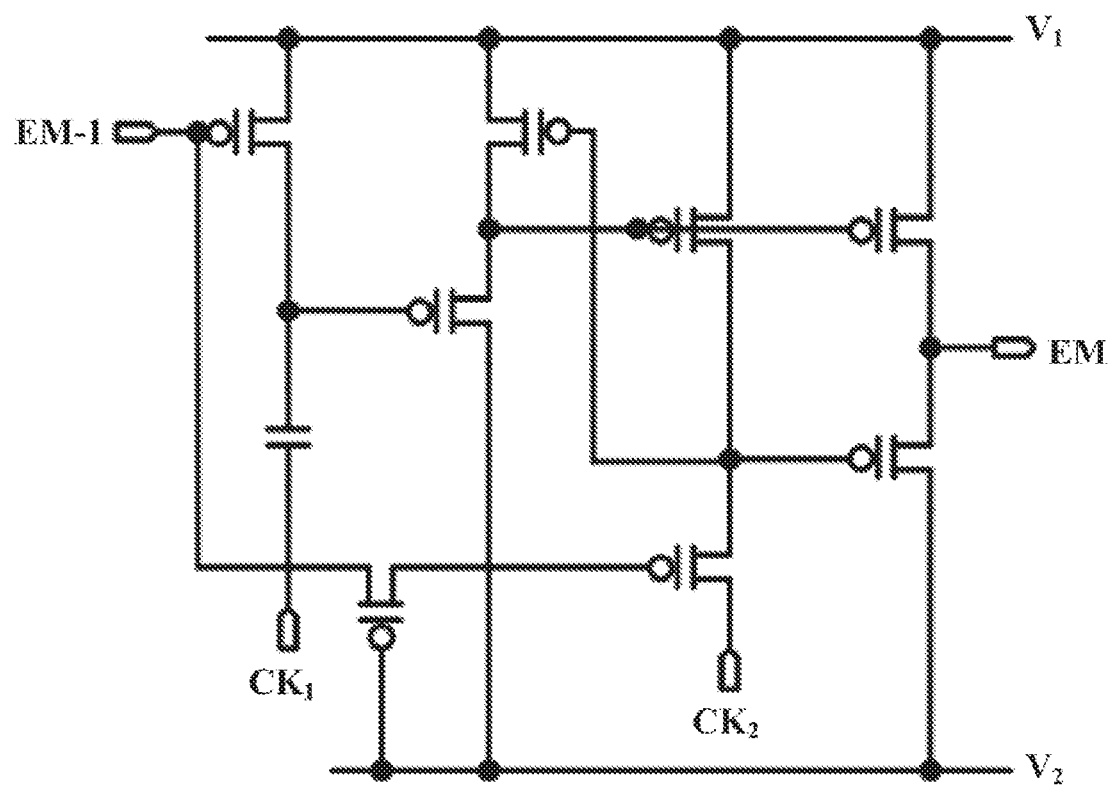
Figure 14:
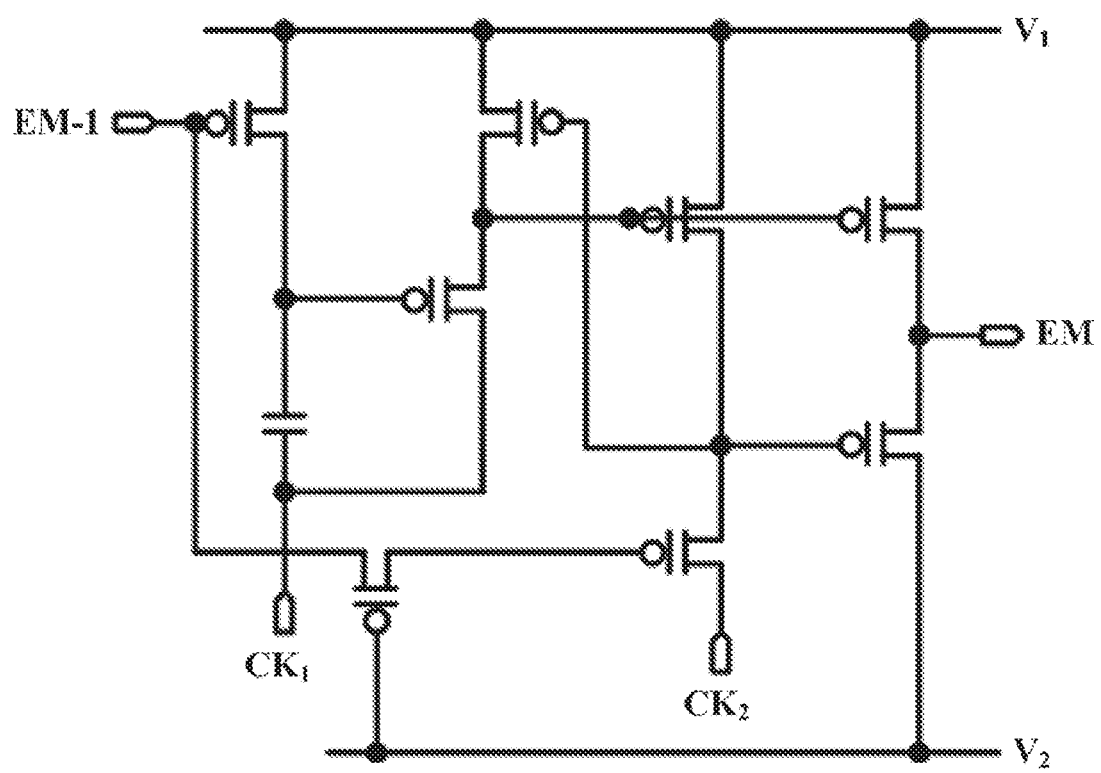
Figure 15:
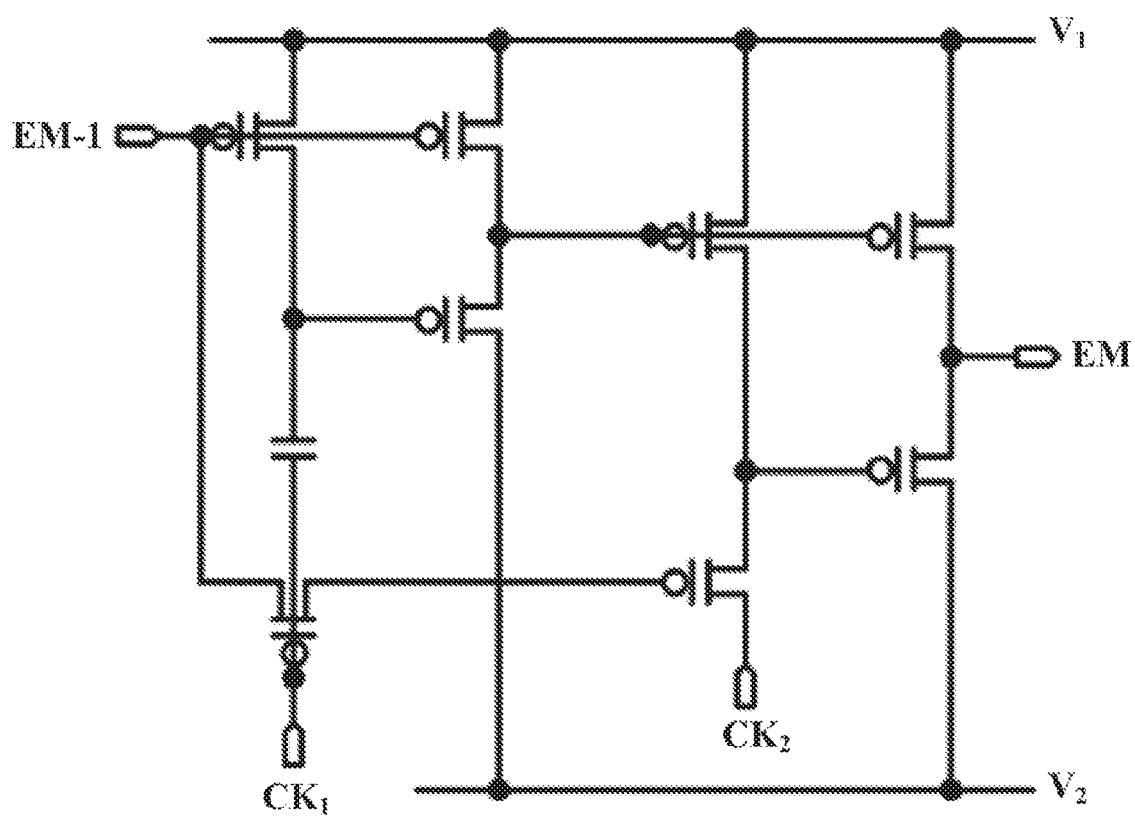
Figure 16:
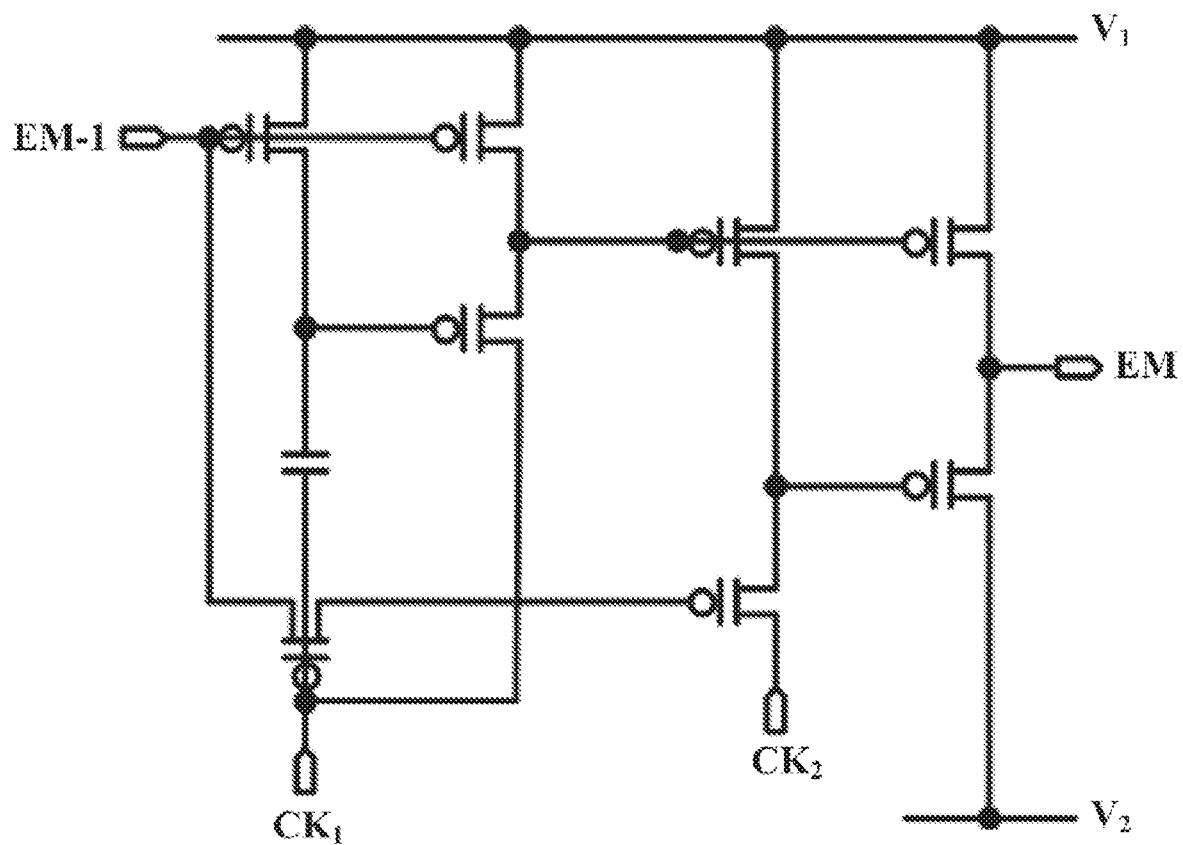
Figure 17:
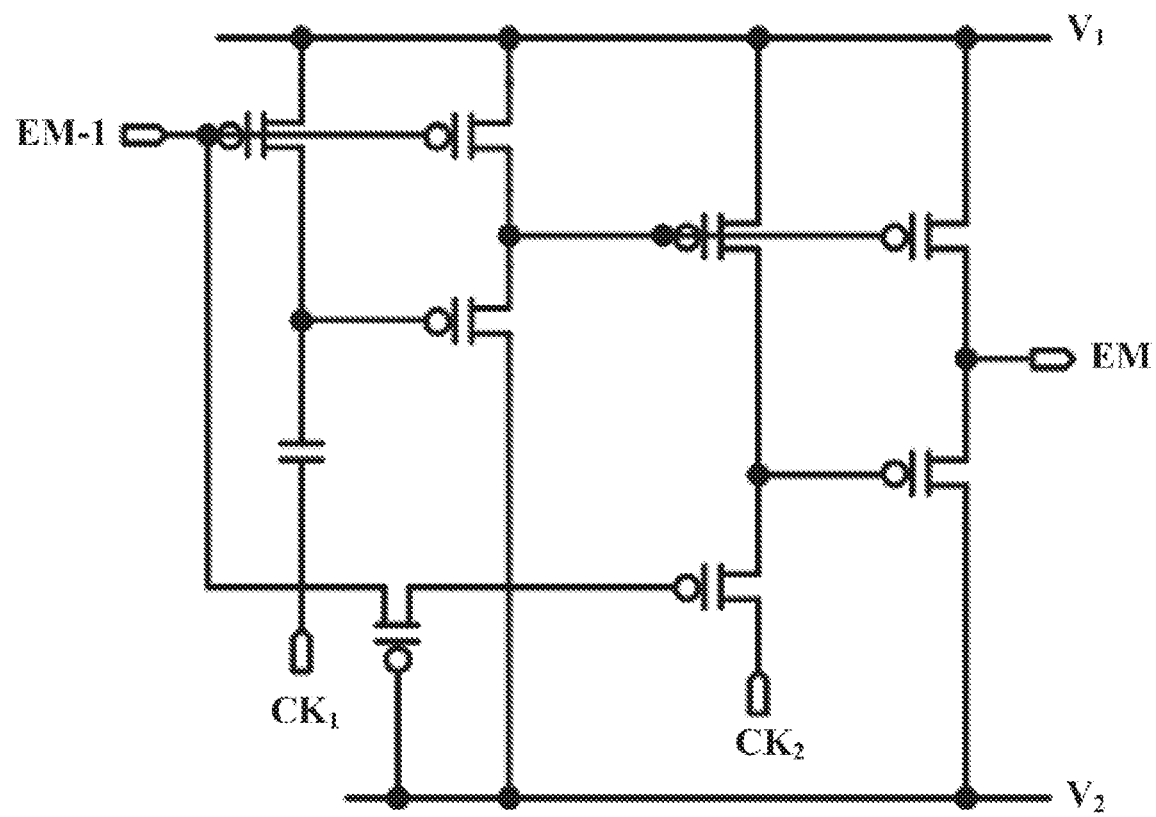
Figure 18:
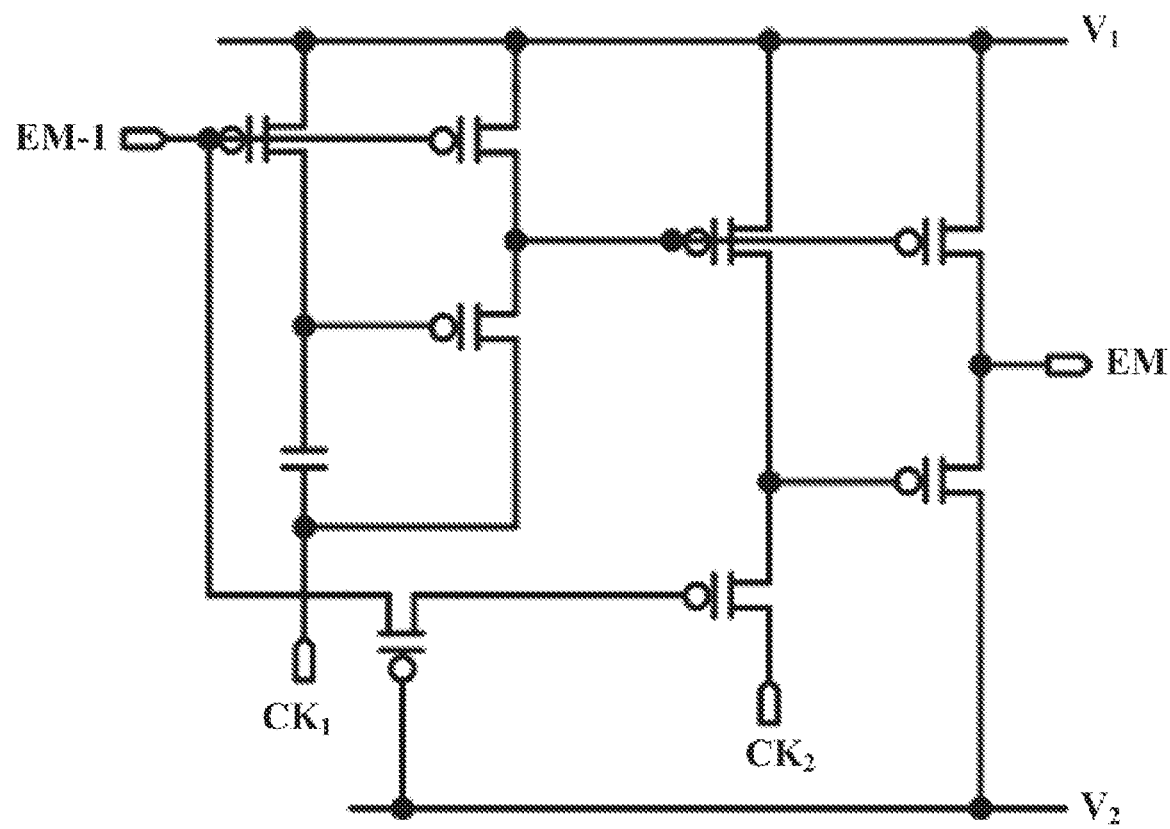

Reference is now made to FIG. 11, which is a schematic diagram illustrating a shift register group consisting of multiple high stability shift registers with adjustable pulse width 1 that are connected in series. Assuming the first voltage $V_1$ and the second voltage $V_2$ are VGL and VGH, respectively, and the second sub-control signal and the third sub-control signal are CK and XCK, respectively; then, a shift register group using multiple serially-connected high stability shift register with adjustable pulse width 1 is as shown in FIG. 11. When multiple high stability shift registers with adjustable pulse width 1 are connected in series to form the shift register group, the output signal EM of the Nth stage high stability shift register with adjustable pulse width 1 shall be the first sub-control signal EM-1 of the (N+1)th stage high stability shift register with adjustable pulse width 1, and N is a positive integer.

Figure 19:
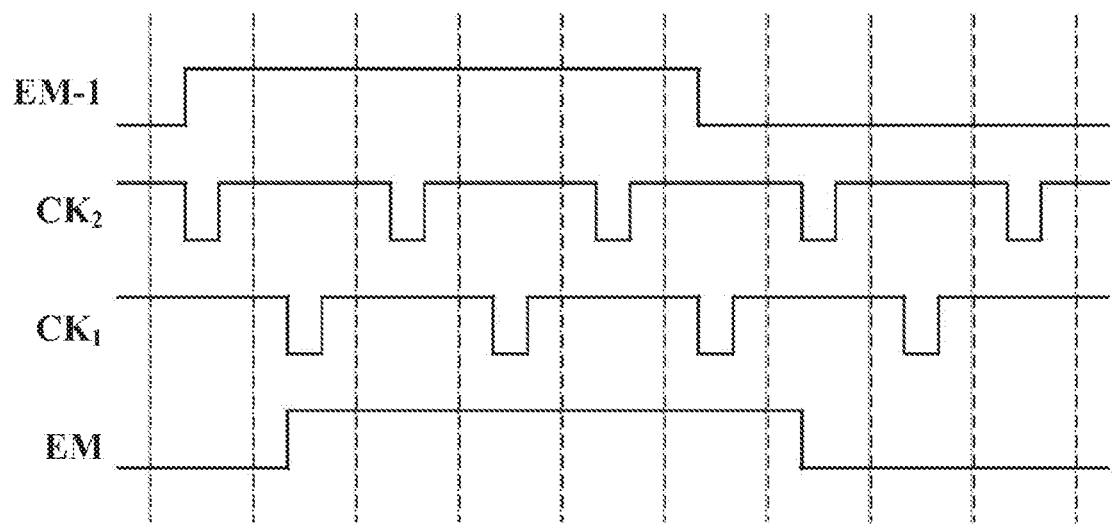
FIG. 19 is an operation timing diagram of the present high stability shift register with adjustable pulse width using the P-type transistor.
Figure 20:
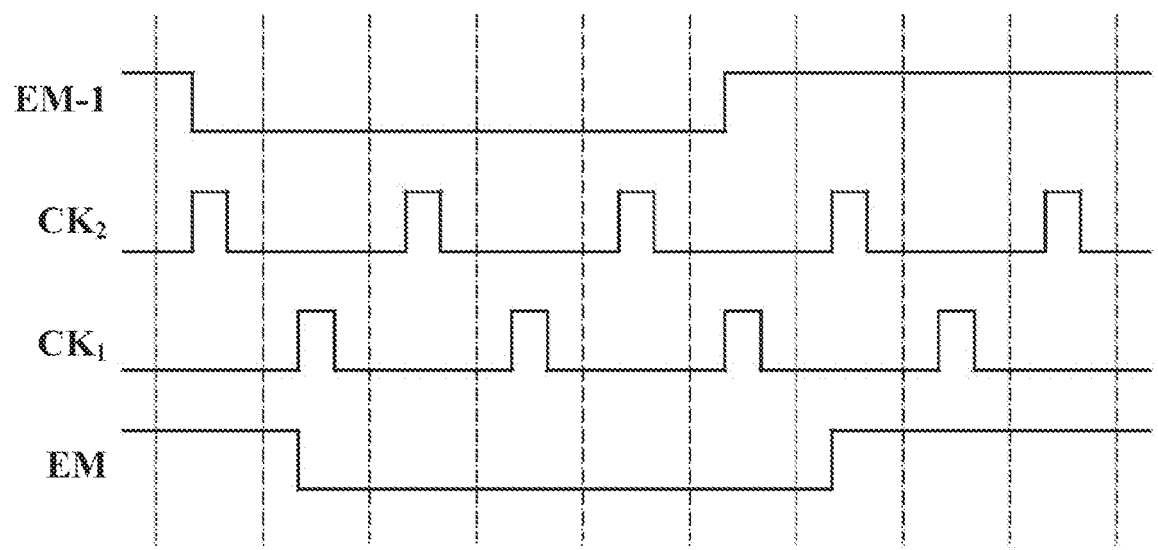
FIG. 20 is an operation timing diagram of the present high stability shift register with adjustable pulse width using the N-type transistor.

Reference is now made to FIG. 12 to FIG. 20, FIG. 12 to FIG. 18 are schematic diagrams illustrating the high stability shift registers with adjustable pulse width according to various embodiments of the present invention; FIG. 19 is an operation timing diagram of the present high stability shift register with adjustable pulse width using the P-type transistor; FIG. 20 is an operation timing diagram of the present high stability shift register with adjustable pulse width using the N-type transistor. The present high stability shift register with adjustable pulse width may be connected in different ways; when all the transistors are P-type transistors, one may use and obtain the timing diagram as shown in FIG. 19; in this case, the first voltage $V_1$ may be a high voltage VGH, and the second voltage $V_2$ may be a low voltage VGL. On the other hand, when the transistors are N-type transistors, one may use and obtain the timing diagram as shown in FIG. 20; in this case, the first voltage $V_1$ is a low voltage VGL, and the second voltage $V_2$ is a high voltage VGH.

Moreover, the present high stability shift register with adjustable pulse width 1 may be used in a gate driver on array (GOA) for driving a panel system. The present high stability shift register with adjustable pulse width 1 can be used not only in the dimming operation of the panel system, but also in the system control switch of the active area.

As compared to conventional techniques, the present high stability shift register with adjustable pulse width uses the first signal processor, the second signal processor and the third signal processor to accomplish the shift register functionality of adjustable pulse width; and since the number of the constituting components is reduced, the amount of data shift is decreased, the stability is also enhanced, and it is advantageous to the development of a narrower border and higher resolution of the display.

The foregoing outlines features of preferred embodiments so that those skilled in the art may better understand the characteristics and spirits of the present disclosure; the above-mentioned preferred embodiments shall not be used to limit the scope of the present invention. To the contrary, the scope of the claims of the present invention intends to cover various modification and equivalent arrangements of these embodiments.

What is claimed is:

1. A high stability shift register with adjustable pulse width, comprising:
   a first signal processor, configured to receive a first voltage and generate a first signal and a second signal in response to a first sub-control signal and a second sub-control signal;
   a second signal processor, configured to receive the first voltage, and generate a third signal and a fourth signal in response to a third sub-control signal, the first signal and the second signal; and
   a third signal processor, configured to receive the first voltage and a second voltage having a voltage level different from that of the first voltage and generate an output signal in response to the third signal and the fourth signal;
   wherein the first signal processor comprises:
      a first transistor, having a first source terminal that is applied with the first voltage and a first gate terminal that is applied with the first sub-control signal;
      a sixth transistor, having a sixth source terminal that is applied with the first sub-control signal and a sixth gate terminal that is applied with the second sub-control signal; and
      a capacitor, having a first electrode that is applied with the second sub-control signal and a second electrode that is connected with a first node electrically connected with a first drain terminal of the first transistor,
      wherein the first signal is outputted from the first node, and the second signal is outputted from a sixth drain terminal of the sixth transistor.

2. The high stability shift register with adjustable pulse width according to claim 1, wherein the second sub-control signal is a first clock signal, wherein the first clock signal has a pulse width less than or equal to one line-time, and the cycle of the first clock signal is two line-times.

3. The high stability shift register with adjustable pulse width according to claim 2, wherein the third sub-control signal is a second clock signal that shifts from the first clock signal by the one line-time.

4. The high stability shift register with adjustable pulse width according to claim 2, wherein the pulse width of the first sub-control signal is (2M−1) line-times, and M is a positive integer.

5. The high stability shift register with adjustable pulse width according to claim 2, wherein the output signal shifts the line-time with respect to the first sub-control signal.

6. The high stability shift register with adjustable pulse width according to claim 1, wherein the second signal processor comprises:
   a second transistor, having a second source terminal that is applied with the first voltage;
   a third transistor, having a third source terminal that is applied with the second voltage, a third gate terminal connected with the first node, and a third drain terminal connected with a second drain terminal of the second transistor;
   a fourth transistor, having a fourth source terminal that is applied with the first voltage, a fourth gate terminal connected with a second node between the second drain terminal and the third drain terminal; and
   a seventh transistor, having a seventh source terminal that is applied with the third sub-control signal, a seventh gate terminal connected with the sixth drain terminal, and a seventh drain terminal connected with a fourth drain terminal of the fourth transistor;
   wherein, the fourth drain terminal and the seventh drain terminal have a fourth node therebetween, the fourth node is connected with a second gate terminal of the second transistor, the third signal is outputted from the second node, and the fourth signal is outputted from the fourth node.

7. The high stability shift register with adjustable pulse width according to claim 6, wherein the third signal processor comprises:
   a fifth transistor, having a fifth source terminal that is applied with the first voltage, and a fifth gate terminal connected with the second node;
   an eighth transistor, having an eighth source terminal that is applied with the second voltage, and an eighth gate terminal connected with the fourth node; and
   an output terminal, connected with an eighth drain terminal of the eighth transistor and a fifth drain terminal of the fifth transistor, and configured to generate the output signal;
   wherein, the transistor of the first signal processor, the transistor of the second signal processor and the transistor of the third signal processor have the same polarity.

8. The high stability shift register with adjustable pulse width according to claim 1, wherein when a plurality of the high stability shift registers with adjustable pulse width are connected in series to form a shift register group, the output signal of the Nth stage of the high stability shift register with adjustable pulse width is the first sub-control signal of the (N+1)th stage of the high stability shift register with adjustable pulse width, and N is a positive integer.

9. The high stability shift register with adjustable pulse width according to claim 1, wherein the high stability shift register with adjustable pulse width is configured to use in a gate driver on array (GOA) for driving a panel system.

* * * * *